US011450720B2

(12) United States Patent
Eo

(10) Patent No.: US 11,450,720 B2
(45) Date of Patent: Sep. 20, 2022

(54) DISPLAY DEVICE

(71) Applicant: Samsung Display Co., Ltd., Yongin-si (KR)

(72) Inventor: Tak Eo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/208,837

(22) Filed: Mar. 22, 2021

(65) Prior Publication Data

US 2021/0233983 A1 Jul. 29, 2021

Related U.S. Application Data

(63) Continuation of application No. 16/691,354, filed on Nov. 21, 2019, now Pat. No. 10,957,753, which is a continuation of application No. 16/273,001, filed on Feb. 11, 2019, now Pat. No. 10,490,616, which is a continuation of application No. 15/911,058, filed on Mar. 2, 2018, now Pat. No. 10,204,971, which is a continuation of application No. 15/274,742, filed on Sep. 23, 2016, now Pat. No. 9,911,798.

(30) Foreign Application Priority Data

Oct. 16, 2015 (KR) .................. 10-2015-0144788

(51) Int. Cl.
*H01L 27/32* (2006.01)
*H01L 51/52* (2006.01)

(52) U.S. Cl.
CPC ...... *H01L 27/3258* (2013.01); *H01L 27/3262* (2013.01); *H01L 51/5253* (2013.01); *H01L 51/5256* (2013.01); *H01L 2251/5338* (2013.01)

(58) Field of Classification Search
CPC ............. H01L 27/3297; H01L 27/3276; H01L 51/5253
See application file for complete search history.

(56) References Cited

U.S. PATENT DOCUMENTS 7,064,482 B2 6/2006 Park
7,131,884 B2 11/2006 Park
7,190,115 B2 3/2007 Tsuchiya et al.
(Continued)

FOREIGN PATENT DOCUMENTS

JP 2007-288078 A 11/2007
KR 10-2005-0084297 A 8/2005
(Continued)

OTHER PUBLICATIONS

Abstract Publication No. 10-2010-0130898, dated Dec. 14, 2010, for KR 10-1155907 B1, 1 page.
(Continued)

*Primary Examiner* — Nicholas J Tobergte
(74) *Attorney, Agent, or Firm* — Lewis Roca Rothgerber Christie LLP

(57) ABSTRACT

A display device includes a substrate including an outer area neighboring a border; and an insulating layer positioned over the substrate and including a plurality of openings positioned over the outer area. The openings are arranged to be spaced from each other in a direction. The display device further includes a wavy line extending in the direction and passing the plurality of openings.

26 Claims, 5 Drawing Sheets

(56) References Cited

U.S. PATENT DOCUMENTS

| | | | |
|---|---|---|---|
| 7,304,427 | B2 | 12/2007 | Park et al. |
| 7,311,577 | B2 | 12/2007 | Park et al. |
| 7,410,817 | B2 | 8/2008 | Oh et al. |
| 7,486,368 | B2 | 2/2009 | Sakakura et al. |
| 7,488,979 | B2 | 2/2009 | Oh et al. |
| 8,159,127 | B2 | 4/2012 | Izumi |
| 8,179,040 | B2 | 5/2012 | Tsuchiya et al. |
| 8,293,595 | B2 | 10/2012 | Yamazaki et al. |
| 8,382,545 | B2 | 2/2013 | Sakakura et al. |
| 8,492,975 | B2 | 7/2013 | Kim |
| 8,665,236 | B2 | 3/2014 | Myers |
| 8,841,710 | B2 | 9/2014 | Yamazaki et al. |
| 8,901,806 | B2 | 12/2014 | Sakakura et al. |
| 9,164,342 | B2 | 10/2015 | Moriwaki |
| 9,257,670 | B2 | 2/2016 | Sakakura et al. |
| 9,508,953 | B2 | 11/2016 | Sakakura et al. |
| 9,740,035 | B2 | 8/2017 | Kwon et al. |
| 9,780,329 | B2 | 10/2017 | Sakakura et al. |
| 9,911,798 | B2 | 3/2018 | Eo |
| 9,966,420 | B2 | 5/2018 | Kim |
| 10,204,971 | B2 | 2/2019 | Eo |
| 10,247,971 | B2 | 4/2019 | Kwon et al. |
| 10,270,056 | B2 | 4/2019 | Sakakura et al. |
| 10,446,769 | B2 | 10/2019 | Kim et al. |
| 10,957,753 | B2 * | 3/2021 | Eo ............ H01L 51/5253 |
| 2007/0023758 | A1 | 2/2007 | Tsurume et al. |
| 2008/0277656 | A1 | 11/2008 | Park et al. |
| 2009/0161048 | A1 | 6/2009 | Satake et al. |
| 2012/0146886 | A1 | 6/2012 | Minami et al. |
| 2014/0097408 | A1 | 4/2014 | Kim et al. |
| 2014/0132487 | A1 | 5/2014 | Park et al. |
| 2014/0138637 | A1 | 5/2014 | Yang et al. |
| 2014/0217373 | A1 | 8/2014 | Youn et al. |
| 2014/0231763 | A1 | 8/2014 | Kim |
| 2014/0232956 | A1 | 8/2014 | Kwon et al. |
| 2014/0306941 | A1 | 10/2014 | Kim et al. |
| 2015/0041769 | A1 | 2/2015 | Kim et al. |
| 2016/0218305 | A1 | 7/2016 | Kim et al. |

FOREIGN PATENT DOCUMENTS

| | | | |
|---|---|---|---|
| KR | 10-2005-0098123 A | 10/2005 | |
| KR | 10-0659763 B1 | 12/2006 | |
| KR | 10-2009-0063194 A | 6/2009 | |
| KR | 10-2010-0138816 A | 12/2010 | |
| KR | 10-1155907 B1 | 6/2012 | |
| KR | 10-2012-0140489 A | 12/2012 | |
| KR | 10-2013-0095579 A | 8/2013 | |
| KR | 10-2014-0045836 A | 4/2014 | |
| KR | 10-2014-0103025 A | 8/2014 | |
| KR | 10-2014-0109153 A | 9/2014 | |
| KR | 10-2015-0015257 A | 2/2015 | |
| KR | 10-2015-0024722 A | 3/2015 | |
| KR | 10-2015-0101500 A | 9/2015 | |

OTHER PUBLICATIONS

Extended European Search Report for corresponding European Patent Application No. 16150810.6, dated May 20, 2016, 10 pages.

Office Action issued in U.S. Appl. No. 14/849,426 by the USPTO, dated Sep. 12, 2016, 14 pages.

Final Office Action issued in U.S. Appl. No. 14/849,426 by the USPTO, dated Jan. 9, 2017, 16 pages.

Office Action issued in U.S. Appl. No. 14/849,426 by the USPTO, dated Jun. 26, 2017, 18 pages.

Final Office Action issued in U.S. Appl. No. 14/849,426 by the USPTO, dated Oct. 19, 2018, 25 pages.

* cited by examiner

DISPLAY DEVICE

CROSS-REFERENCE TO RELATED APPLICATIONS

This application is a continuation of U.S. patent application Ser. No. 16/691,354, filed Nov. 21, 2019, which is a continuation of U.S. patent application Ser. No. 16/273,001, filed Feb. 11, 2019, now U.S. Pat. No. 10,490,616, which is a continuation of U.S. patent application Ser. No. 15/911,058, filed Mar. 2, 2018, now U.S. Pat. No. 10,204,971, which is a continuation of U.S. patent application Ser. No. 15/274,742, filed Sep. 23, 2016, now U.S. Pat. No. 9,911,798, which claims priority to and the benefit of Korean Patent Application No. 10-2015-0144788, filed Oct. 16, 2015, the entire contents of all of which are incorporated herein by reference.

BACKGROUND

1. Field

The described technology relates generally to a display device.

2. Discussion of the Related Technology

A display device is a device that displays an image, and recently organic light emitting diode displays have been attracting attention.

Organic light emitting diode displays have a self-emission characteristic and do not require a separate light source, unlike liquid crystal displays, and thus their thickness and weight may be reduced. Further, organic light emitting diode displays have high quality characteristics, such as low power consumption, high luminance, and high response speed.

In general, an organic light emitting diode display includes a substrate, a plurality of thin film transistors positioned on the substrate, a plurality of insulating layers disposed between wirings configuring the thin film transistors, and an organic light emitting element connected to the thin film transistor.

Recently, flexible organic light emitting diode displays, which include a flexible substrate made of a polymer material as the substrate, have been developed.

The above information disclosed in this Background section is only to enhance the understanding of the background of the described technology and therefore it may contain information that does not form the prior art that is already known in this country to a person of ordinary skill in the art.

SUMMARY

An embodiment provides a display device having improved durability.

One aspect of the invention provides a display device, which may comprise: a substrate comprising an outer area neighboring a border; an insulating layer positioned over the substrate and comprising a plurality of openings positioned over the outer area, the plurality of openings being disposed to be spaced from each other in a direction; and a wavy line extending in the direction and passing the plurality of openings.

In the foregoing device, the wavy line may be curved and extend along the top surfaces of the insulating layer and the bottom surfaces of the plurality of openings. The wavy line may contact the insulating layer. The display device may further comprise a cover layer covering the plurality of openings and the wavy line. The cover layer may have an island shape. The cover layer may comprise an organic material. The insulating layer may comprise an inorganic material. The insulating layer may comprise an organic material.

Still in the foregoing device, the device may further comprise a display unit neighboring the outer area and positioned over the substrate and comprising an array of pixels. Each pixel of the display unit may comprise an organic light emitting element positioned on the substrate; and a thin film transistor connected to the organic light emitting element. The organic light emitting element may comprise: a first electrode connected to the thin film transistor; an organic emission layer positioned over the first electrode; and a second electrode positioned over the organic emission layer. The thin film transistor may comprise: an active layer positioned over the substrate; a gate electrode positioned over the active layer; and a source electrode and a drain electrode connected to the active layer. The wavy line may be positioned on a layer the same as that of at least one of the gate electrode and the source electrode. The insulating layer may further comprise a first sub-insulating layer covering the gate electrode. The plurality of openings may be formed in the first sub-insulating layer. The insulating layer may further comprise a second sub-insulating layer covering the active layer. The plurality of openings may be formed on at least one layer of the first sub-insulating layer and the second sub-insulating layer. The insulating layer may further comprise a third sub-insulating layer positioned between the substrate and the active layer. The plurality of openings may be formed on at least one layer among the first sub-insulating layer, the second sub-insulating layer, and the third sub-insulating layer.

Another aspect of the present invention provides a display device including a substrate including an outer area neighboring a border; an insulating layer positioned on the substrate and including a plurality of opening patterns corresponding to the outer area and disposed to be separated from each other in one direction; and a wavy line extending in one direction and passing the plurality of opening patterns.

The wavy line may be curved and extend along the surface of the insulating layer and each lower part of the plurality of opening patterns.

The wavy line may contact the insulating layer.

A cover pattern covering the opening patterns and the wavy line may be further included.

The cover pattern may have an island shape.

The cover pattern may include an organic material.

The insulating layer may include an inorganic material.

A display unit neighboring the outer area and positioned on the substrate may be further included.

The display unit may include an organic light emitting element positioned on the substrate and a thin film transistor connected to the organic light emitting element.

The organic light emitting element may include a first electrode connected to the first thin film transistor, an organic emission layer positioned on the first electrode, and a second electrode positioned on the organic emission layer.

The thin film transistor may include an active layer positioned on the substrate, a gate electrode positioned on the active layer, and a source electrode and a drain electrode connected to the active layer.

The wavy line may be positioned on the same layer as at least one of the gate electrode and the source electrode.

The insulating layer may further include a first sub-insulating layer covering the gate electrode.

The opening pattern may be formed in the first sub-insulating layer.

The insulating layer may further include a second sub-insulating layer covering the active layer.

The opening pattern may be formed in at least one layer of the first sub-insulating layer and the second sub-insulating layer.

The insulating layer may further include a third sub-insulating layer positioned between the substrate and the active layer.

The opening pattern may be formed in at least one layer among the first sub-insulating layer, the second sub-insulating layer, and the third sub-insulating layer.

The insulating layer may include an inorganic material.

The insulating layer may include an organic material.

According to one of the described embodiments, a display device with improved durability is provided.

DETAILED DESCRIPTION

Figure 1:
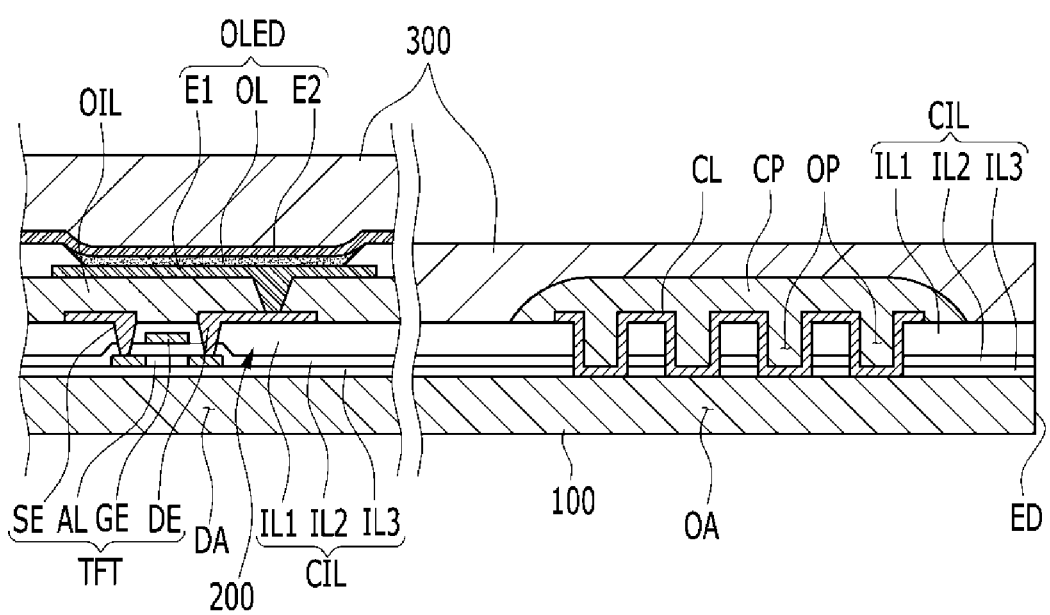
FIG. 1 is a cross-sectional view showing a part of a display device according to an embodiment.

Hereinafter, embodiments of the present invention will be described more fully with reference to the accompanying drawings, in which embodiments of the invention are shown. As those skilled in the art would realize, the described embodiments may be modified in various different ways, all without departing from the spirit or scope of the present invention.

In addition, the size and thickness of each configuration shown in the drawings are arbitrarily shown for understanding and ease of description, but the present invention is not limited thereto.

In the drawings, the thickness of layers, films, panels, regions, etc., are exaggerated for clarity. In the drawings, the thicknesses of some layers and areas are exaggerated for understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a direction of gravity.

Now, a display device according to an embodiment will be described with reference to FIG. 1.

Hereinafter, an organic light emitting diode display including an organic light emitting element will be described as one example of the display device; however, other embodiments may be various display devices that include a display unit displaying an image, such as a liquid crystal display (LCD).

FIG. 1 is a cross-sectional view showing a part of a display device according to an embodiment. FIG. 1 is a cross-sectional view showing a center part and an outer part of the display device according to an embodiment.

As shown in FIG. 1, the display device according to an embodiment includes a substrate 100, a display unit 200, a first insulating layer CIL, wavy line CL, a second insulating layer OIL, a cover layer CP, and an encapsulation part 300. The display device include an array of pixels, each of which includes an organic light emitting element.

The substrate 100 may be flexible, but it is not limited thereto, and therefore it may be stretchable, foldable, bendable, or rollable. The substrate 100 is flexible, stretchable, foldable, bendable, or rollable, such that the entire display device may be flexible, stretchable, foldable, bendable, or rollable.

The substrate 100 may include at least one among the polymer materials, such as a polyimide, a metal material, and an inorganic material, however it is not limited thereto and any material that can be bent may be included. The substrate 100 may have a film shape.

The substrate 100 includes a display area DA and an outer area or a boundary area OA adjacent to a border or an edge ED. The outer area OA of the substrate 100 is an outer part of the substrate 100. The display area DA of the substrate 100 is an area adjacent to the outer area OA and displays the image, and this display area DA is the center part of the substrate 100. In embodiments, when viewed in a viewing direction perpendicular to a major surface, the boundary area OA surrounds the display area DA on which the pixels are disposed.

On the other hand, in an embodiment, the outer area OA is located outside the substrate 100, however it is not limited thereto, and the outer area OA may be located on the center of the substrate 100 or may overlap the display area DA in another embodiment.

The display unit 200 is positioned on the substrate 100 while corresponding to the display area of the substrate 100 and may display an image by using a plurality of pixels. Here, a pixel may mean a minimum unit for displaying an image.

The display unit 200 includes an organic light emitting element OLED emitting light and a thin film transistor TFT connected to the organic light emitting element OLED.

On the other hand, in an embodiment, for convenience of description, the display unit 200 includes the organic light emitting element OLED and the thin film transistor TFT, however it is not limited thereto, and the display unit 200 may further include at least one scan wiring, at least one data wire, a plurality of thin film transistors, and at least one capacitor, and these disclosed elements may have various structures The thin film transistor TFT includes an active layer AL, a gate electrode GE, a source electrode SE, and a drain electrode DE.

The active layer AL is located on the substrate 100 and may be made of a polysilicon or an oxide semiconductor. The oxide semiconductor may be based on one of titanium (Ti), hafnium (Hf), zirconium (Zr), aluminum (Al), tantalum (Ta), germanium (Ge), zinc (Zn), gallium (Ga), tin (Sn), or indium (In), zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O), which are complex oxides thereof.

The active layer AL includes a channel area in which impurities are not doped, and a source area and a drain area in which impurities are doped at respective sides of the channel area. Herein, the impurities vary according to a kind of thin film transistor, and may be N-type impurities or P-type impurities. When the active layer AL is formed of the oxide semiconductor, a separate passivation layer may be added in order to protect the oxide semiconductor, which is vulnerable to the external environment such as exposure to a high temperature.

The gate electrode GE is positioned on the active layer AL, and the source electrode SE and the drain electrode DE are positioned on the gate electrode GE and are respectively connected to the source region and the drain region of the active layer AL through contact holes.

To prevent shorting of the active layer AL, the gate electrode GE, the source electrode SE, and the drain electrode DE, as the elements of the thin film transistor TFT, the first insulating layer CIL is positioned between the elements of the thin film transistor TFT.

The organic light emitting element OLED includes a first electrode E1 connected to a drain electrode DE of the thin film transistor TFT through a contact hole formed in the second insulating layer OIL, an organic emission layer OL positioned on the first electrode E1, and a second electrode E2 positioned on the organic emission layer OL.

The first electrode E1 may be an anode, which is a hole injection electrode, and may be any one of a light reflective electrode, a light transflective electrode, and a light transmitting electrode. Meanwhile, in another embodiment, the first electrode E1 may be a cathode, which is an electron injection electrode.

The organic emission layer OL is positioned on the first electrode E1. The organic emission layer OL may be formed of a low molecular organic material or a high molecular organic material such as poly 3,4-ethylenedioxythiophene (PEDOT), or the like. The organic emission layer OL may include a red organic emission layer emitting red light, a green organic emission layer emitting green light, and a blue organic emission layer emitting blue light, wherein the red organic emission layer, the green organic emission layer, and the blue organic emission layer are respectively formed in a red pixel, a green pixel, and a blue pixel to implement a color image.

The red organic emission layer, the green organic emission layer, and the blue organic emission layer are stacked as the organic emission layer OL in all of the red pixel, the green pixel, and the blue pixel and a red color filter, a green color filter, and a blue color filter are formed in each pixel, thereby making it possible to implement the color image.

As another example, a white organic emission layer emitting white light is formed as the organic emission layer OL in all of the red pixel, the green pixel, and the blue pixel and a red color filter, a green color filter, and a blue color filter are formed in each pixel, thereby making it possible to implement the color image. In the case of implementing the color image using the white organic emission layer, which is the organic emission layer OL, and the color filter, deposition masks for depositing the red organic emission layer, the green organic emission layer, and the blue organic emission layer on the respective individual pixels, in embodiments, the red pixel, the green pixel, and the blue pixel do not need to be used. The white organic emission layer, which is the organic emission layer OL described in another example, may be formed of one organic emission layer or may include a configuration in which a plurality of organic emission layers are stacked to emit white light.

As an example, the organic emission layer OL may include a configuration in which at least one yellow organic emission layer and at least one blue organic emission layer are combined with each other to allow white light to be emitted, a configuration in which at least one cyan organic emission layer and at least one red organic emission layer are combined with each other to allow white light to be emitted, a configuration in which at least one magenta organic emission layer and at least one green organic emission layer are combined with each other to allow white light to be emitted, and the like.

The second electrode E2 may be positioned on the organic emission layer EL and may be a cathode, which is an electron injection electrode. The second electrode E2 may be any one of a light reflective electrode, a light transflective electrode, and a light transmitting electrode. The second electrode E2 is positioned over the entirety of the display area DA of the substrate SUB so as to cover the organic emission layer EL. Meanwhile, in another embodiment, the second electrode E2 may be an anode, which is a hole injection electrode.

The first insulating layer CIL includes a first sub-insulating layer ILL a second sub-insulating layer IL2, and a third sub-insulating layer IL3.

The first sub-insulating layer IL1 covers the gate electrode GE and functions to prevent shorting between the gate electrode GE and the source electrode SE. The first sub-insulating layer IL1 may be formed of at least one layer.

The second sub-insulating layer IL2 covers the active layer AL and is positioned between the active layer AL and the gate electrode GE. The second sub-insulating layer IL2 may function to prevent the shorting between the active layer AL and the gate electrode GE. The second sub-insulating layer IL2 may be formed of at least one layer.

The third sub-insulating layer IL3 is positioned between the substrate 100 and the active layer AL and may function to flatten the surface of the substrate 100 and simultaneously prevent moisture from permeating the substrate 100.

As such, the first insulating layer CIL includes an inorganic material such as silicon nitride or silicon oxide; for example, the first insulating layer CIL may include at least one among SiNx, $Al_2O_3$, $SiO_2$, and $TiO_2$.

The first insulating layer CIL includes a plurality of openings OP disposed to be separated from each other in one direction corresponding to the outer area OA of the substrate 100. Here, one direction may be a direction from the display area DA of the substrate 100 to the outer area OA, or a direction from the outer area OA of the substrate 100 to the border ED of the substrate 100, however it is not limited thereto and the direction may differ from the above-described direction.

The opening OP is formed in the first insulating layer CIL, more specifically, the opening OP is formed in the first sub-insulating layer ILL the second sub-insulating layer IL2, and the third sub-insulating layer IL3 included in the first insulating layer CIL.

On the other hand, in an embodiment, the opening OP is formed in the first sub-insulating layer ILL the second sub-insulating layer IL2, and the third sub-insulating layer IL3, however it is not limited thereto and the opening OP may be formed in at least one of the first sub-insulating layer ILL the second sub-insulating layer IL2, and the third sub-insulating layer IL3.

The distance between the adjacent openings OP among the plurality of openings OP may have a predetermined distance, however it is not limited thereto and the distance between the adjacent openings OP may change depending on a design. The plurality of openings OP may have a linear, a nonlinear, or an island form when viewed in the viewing direction.

The wavy line or undulating line CL may include the same material as at least one among the gate electrode GE, the source electrode SE, the drain electrode DE of the thin film transistor TFT included in the display unit 200. For example, the wavy line CL is positioned on the same layer as the source electrode SE and the drain electrode DE, includes the same material as the source electrode SE and the drain electrode DE, and may be simultaneously formed with the source electrode SE and the drain electrode DE.

Meanwhile, in an embodiment, the wavy line CL is positioned on the same layer as the source electrode SE and the drain electrode DE, however it is not limited thereto and the wavy line CL may be positioned on the same layer as at least one among the active layer AL, the gate electrode GE, the source electrode SE, and the drain electrode DE. The wavy line CL may include a metal material.

The wavy line CL corresponds to the outer area OA of the substrate 100 and is positioned on the first insulating layer CIL and extends in the direction in which the plurality of openings OP are separated to have the plurality of openings OP. The wavy line CL is curved and extends along the surface of the first insulating layer CIL and each lower part of the plurality of openings OP. The wavy line CL contacts the first insulating layer CIL, is curved, and extends, more specifically, the wavy line CL is curved several times in the direction vertical to the surface of the substrate 100 and extends in the direction parallel to the surface of the substrate 100 along the pattern of the first insulating layer CIL having the island shape formed by the plurality of openings OP and separated from each other, thereby vertically having a serpentine form. In an embodiment, the wavy line CL has the vertically serpentine form, however it is not limited thereto and the wavy line CL may have a horizontally serpentine form in another embodiment. In this case, the wavy line CL may be curved several times in the direction parallel to the surface of the substrate 100 and may extend in the direction parallel to the surface of the substrate 100.

As described above, in the display device according to an embodiment, as the first insulating layer CIL includes the plurality of openings OP disposed to be separated from each other in a direction by corresponding to the outer area OA of the substrate 100, the part of the first insulating layer CIL positioned corresponding to the outer area OA has the island shape on the substrate 100. By having the first insulating layer CIL positioned at the outer area OA neighboring the border ED of the substrate 100 on the substrate 100, even if an external impact is applied to the border ED of the substrate 100 such that the stress is applied to the first insulating layer CIL, since the stress is blocked by the opening OP, the stress is inhibited from being transmitted to the display unit 200 through the first insulating layer CIL.

In embodiments, although the first insulating layer CIL has a unique brittleness for the inorganic material, since the first insulating layer CIL includes the plurality of openings OP disposed to be separated or spaced from each other in a direction by corresponding to the outer area OA of the substrate 100, even if stress is applied to the border ED of the substrate 100, the stress is blocked by the opening OP, and the stress is minimized from being transmitted to the display unit 200.

Also, in the display device according to an embodiment, since the wavy line CL has a vertically winding shape corresponding to the outer area OA, even if an impact is applied to the border ED of the substrate 100 such that the stress is applied to the wavy line CL, since the stress is dispersed along the long path of the wavy line CL within the outer area OA, the wavy line CL and the first insulating layer CIL covering the wavy line CL are prevented from being destroyed by the stress.

The second insulating layer OIL is positioned between the first electrode E1 of the organic light emitting element OLED and the drain electrode DE of the thin film transistor TFT. The second insulating layer OIL includes a contact hole, and the first electrode E1 and the drain electrode DE are connected through the contact hole. The second insulating layer OIL includes an organic material, including at least one among polyimide, phenylene, and siloxane.

The cover layer CP is positioned on the wavy line CL corresponding to the outer area OA of the substrate 100. The cover layer CP covers the openings OP and the wavy line CL. The cover layer CP has an island shape and the surface of the cover layer CP has a curved shape. The cover layer CP is positioned on the same layer as the second insulating layer OIL, thereby including the same material as the second insulating layer OIL and being simultaneously formed with the second insulating layer OIL. Accordingly, the second insulating layer OIL may include the organic material.

Meanwhile, in an embodiment, the cover layer CP is positioned on the same layer as the second insulating layer OIL, however it is not limited thereto and the cover layer CP may be positioned from the second insulating layer OIL, thereby including material different from the second insulating layer OIL.

As described above, in the display device according to an embodiment, since the cover layer CP including the organic material covers the openings OP and the wavy line CL, even if an impact is applied to the border ED of the substrate 100 such that stress is applied to the openings OP and the wavy line CL, since the cover layer CP is deformed by the stress such that the stress is dispersed within the cover layer CP, the wavy line CL, the first insulating layer CIL covering the wavy line CL, and the cover layer CP are prevented from being destroyed by the stress.

Also, in the display device according to an embodiment, although the first insulating layer CIL includes an inorganic material, such that the first insulating layer CIL is brittle, since the wavy line CL covering the openings OP of the first insulating layer CIL includes a metal material, and simultaneously the cover layer CP covering the wavy line CL includes the organic material, the first insulating layer CIL, the wavy line CL, and the cover layer CP are prevented from being destroyed by the stress. In embodiments, the display device with improved durability is provided.

The encapsulation part 300 is positioned on the substrate 100. The encapsulation part 300 is positioned on the substrate 100 throughout the display area DA and the outer area OA of the substrate 100 and encapsulates the display unit 200 along with the substrate 100. The encapsulation part 300 may be formed of a thin film encapsulation. The encapsulation part 300 may include an organic layer and an inorganic layer positioned on the organic layer. As one example, the encapsulation part 500 may include one or more organic layers and one or more inorganic layers, which are alternately laminated, and more specifically, there may be a plurality of the inorganic layers or the organic layers, and the plurality of inorganic layers and the plurality of organic layers may be alternately laminated.

The encapsulation part 300 may include at least one sandwich structure in which at least one organic layer is inserted between at least two inorganic layers. The inorganic layer positioned on the top layer of the encapsulation part 300 may be laminated with a larger area than the organic layer so as to cover an end of the organic layer, which is another layer. The organic layer of the encapsulation part 300 is made of polymer, and preferably, may be a single layer or a laminated layer formed of any one of polyethylene terephthalate, polyimide, polycarbonate, epoxy, polyethylene, and polyacrylate. For example, the organic layer may be formed of polyacrylate, and more specifically, includes a material in which a monomer composition including diacrylate-based monomers and triacrylate-based monomers is polymerized. Herein, the monomer composition may further include monoacrylate-based monomers, and further include a known photo-initiator such as TOP, but is not limited thereto. The inorganic layer of the encapsulation part 500 may be a single layer or a laminated layer including metal oxide or metal nitride. More specifically, the inorganic layer may include one or more of $SiN_x$, $Al_2O_3$, $SiO_2$, and $TiO_2$.

A protection film may be positioned at each of an upper portion of the encapsulation part 300 and a lower portion of the flexible substrate 100, and at least one optical film of a phase difference film and a polarization film may be positioned on or under the protection film.

As described above, in the display device according to an embodiment, since the first insulating layer CIL includes the plurality of openings OP disposed to be separated or spaced from each other in a direction corresponding to the outer area OA of the substrate 100, the part of the first insulating layer CIL positioned corresponding to the outer area OA has the island shape on the substrate 100. Since the first insulating layer CIL positioned at the outer area OA neighboring the border ED of the substrate 100 on the substrate 100, even if an external impact is applied to the border ED of the substrate 100 such that stress is applied to the first insulating layer CIL, since the stress is blocked by the opening OP, the stress is inhibited from be transmitted to the display unit 200 through the first insulating layer CIL.

In embodiments, although the first insulating layer CIL has a unique brittleness for the inorganic material, since the first insulating layer CIL includes the plurality of openings OP disposed to be separated from each other in the direction corresponding to the outer area OA of the substrate 100, even if stress is applied to the border ED of the substrate 100, the stress is blocked by the opening OP, and thus the stress is minimized from being transmitted to the display unit 200.

Also, in the display device according to an embodiment, since the wavy line CL has the vertically winding shape corresponding to the outer area OA, even if the impact is applied to the border ED of the substrate 100 such that stress is applied to the wavy line CL, since the stress is dispersed along the long path of the itself wavy line CL within the outer area OA, the wavy line CL and the first insulating layer CIL covering the wavy line CL are prevented from being destroyed by the stress.

Also, in the display device according to an embodiment, since the cover layer CP including the organic material covers the openings OP and the wavy line CL, even if the impact is applied to the border ED of the substrate 100 such that the stress is applied to the openings OP and the wavy line CL, since the cover layer CP is deformed by the stress such that the stress is dispersed within the cover layer CP, the wavy line CL, the first insulating layer CIL covering the wavy line CL, and the cover layer CP are prevented from being destroyed by the stress.

Also, in the display device according to an embodiment, although the first insulating layer CIL includes an inorganic material such that the first insulating layer CIL is brittle, since the wavy line CL covering the openings OP of the first insulating layer CIL includes a metal material, and simultaneously the cover layer CP covering the wavy line CL includes an organic material, the first insulating layer CIL, the wavy line CL, and the cover layer CP are prevented from being destroyed by the stress.

In embodiments, by including the first insulating layer CIL with the opening OP, the wavy line CL, and the cover layer CP, the display device with improved durability is provided.

Next, the display device according to another embodiment will be described with reference to FIG. 2. Hereinafter, parts of the display device according to an embodiment, different from those described above, will be described.

Figure 2:
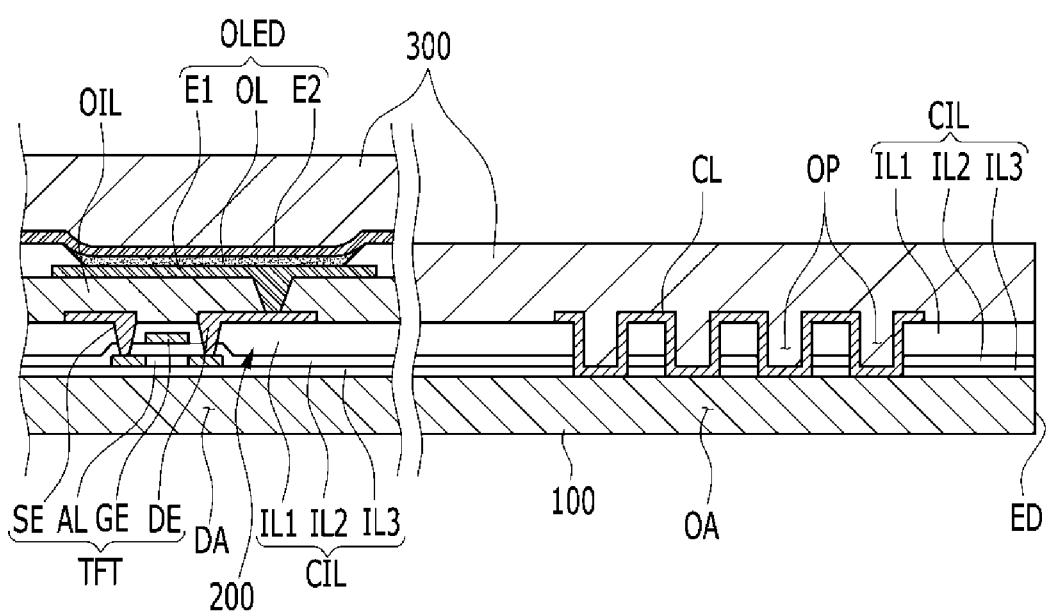
FIG. 2 is a cross-sectional view showing a part of a display device according to another embodiment.

FIG. 2 is a cross-sectional view of a part of a display device according to another embodiment.

As shown in FIG. 2, the display device according to another embodiment includes the substrate 100, the display unit 200, the first insulating layer CIL, the wavy line CL, the second insulating layer OIL, and the encapsulation part 300.

At least one layer among the first sub-insulating layer IL1, the second sub-insulating layer IL2, and the third sub-insulating layer IL3 of the first insulating layer CIL includes an organic material, including at least one among polyimide, phenylene, and siloxane. In embodiments, the first insulating layer CIL includes an organic material including at least one among polyimide, phenylene, and siloxane.

The plurality of openings OP is formed in the first insulating layer CIL, and more specifically, is formed in the first sub-insulating layer IL1, the second sub-insulating layer IL2, and the third sub-insulating layer IL3.

As described, since the first insulating layer CIL according to another embodiment includes a large Young's modulus, even if an impact is applied to the border ED of the substrate 100 such that stress is applied to the openings OP and the wavy line CL, since the first insulating layer CIL is deformed by the stress such that the stress is dispersed within the first insulating layer CIL, the wavy line CL and the first insulating layer CIL covered by the wavy line CL is prevented from being destroyed by the stress.

According to another embodiment, by including the first insulating layer CIL formed with the opening OP and including an organic material and the wavy line CL, the display device with improved the durability is provided.

Next, the display device according to another embodiment will be described with reference to FIG. 3. Hereinafter, parts of the display device according to an embodiment, different from those described above, will be described.

Figure 3:
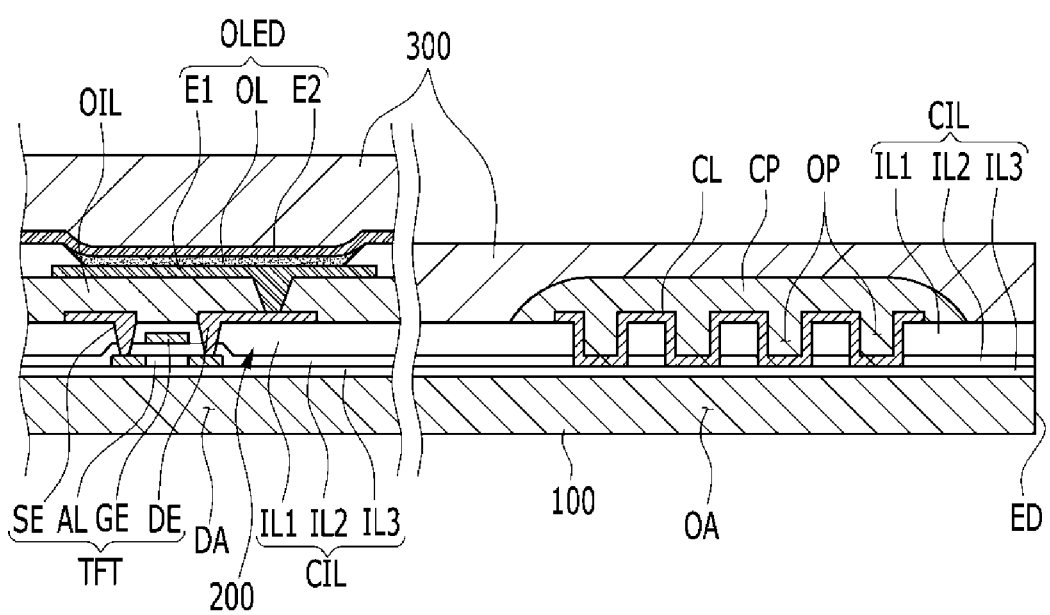
FIG. 3 is a cross-sectional view showing a part of a display device according to another embodiment.

FIG. 3 is a cross-sectional view of a part of a display device according to another embodiment.

As shown in FIG. 3, the display device according to another embodiment includes the substrate 100, the display unit 200, the first insulating layer CIL, the wavy line CL, the second insulating layer OIL, the cover layer CP, and the encapsulation part 300.

The plurality of openings OP is formed in the first insulating layer CIL, and more specifically, is formed in the first sub-insulating layer IL1 and the second sub-insulating layer IL2.

The wavy line CL is positioned on the same layer as the source electrode SE and the drain electrode DE, and thus includes the same material as the source electrode SE and the drain electrode DE and is simultaneously formed with the source electrode SE and the drain electrode DE.

As described above, in the display device according to another embodiment, since the first insulating layer CIL includes the plurality of openings OP disposed to be separated from each other in the direction corresponding to the outer area OA of the substrate 100, the part of the first insulating layer CIL positioned corresponding to the outer area OA has the island shape on the substrate 100. Since the first insulating layer CIL is positioned at the outer area OA neighboring the border ED of the substrate 100 on the substrate 100, even if an external impact is applied to the border ED of the substrate 100 such that stress is applied to the first insulating layer CIL, since the stress is blocked by the opening OP, the stress is inhibited from be transmitted to the display unit 200 through the first insulating layer CIL.

As described, although the first insulating layer CIL has a unique brittleness for the inorganic material, since the first insulating layer CIL includes the plurality of openings OP disposed to be separated from each other in the direction corresponding to the outer area OA of the substrate 100, even if the stress is applied to the border ED of the substrate 100, the stress is blocked by the opening OP, and the stress transmitted to the display unit 200 is reduced.

In embodiments, by including the first insulating layer CIL including the plurality of openings OP, the wavy line CL, and the cover layer CP, the display device with improved durability is provided.

Next, the display device according to another embodiment will be described with reference to FIG. 4. Hereinafter, parts of the display device according to an embodiment, different from those described above, will be described.

Figure 4:
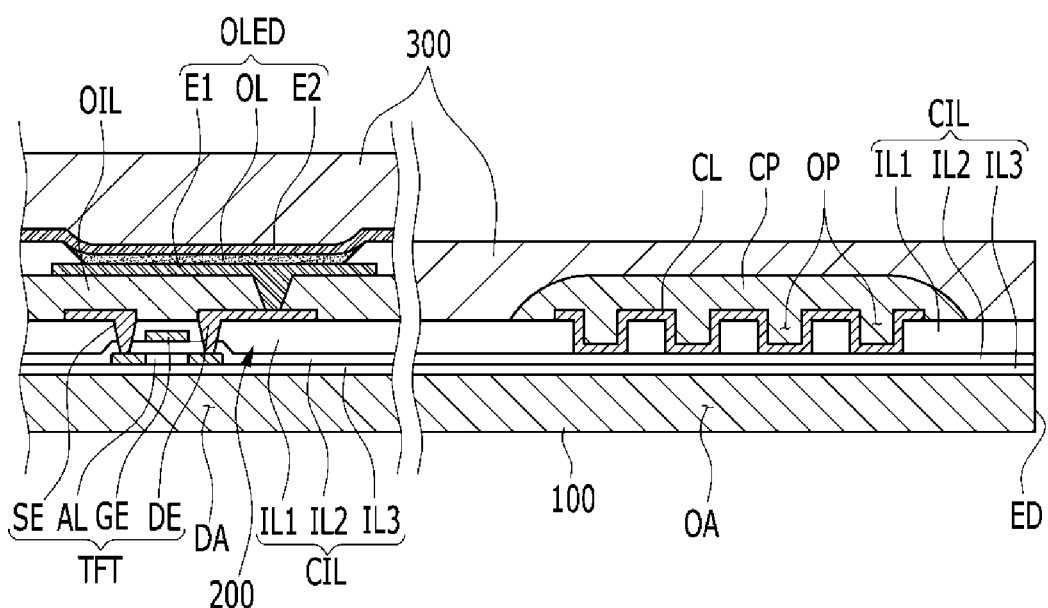
FIG. 4 is a cross-sectional view showing a part of a display device according to another embodiment.

FIG. 4 is a cross-sectional view of a part of a display device according to another embodiment.

As shown in FIG. 4, the display device according to another embodiment includes the substrate 100, the display unit 200, the first insulating layer CIL, the wavy line CL, the second insulating layer OIL, the cover layer CP, and the encapsulation part 300.

The opening OP is formed in the first insulating layer CIL, and more specifically, is formed in the first sub-insulating layer IL1.

The wavy line CL is positioned on the same layer as the source electrode SE and the drain electrode DE, and thus includes the same material as the source electrode SE and the drain electrode DE and is simultaneously formed with the source electrode SE and the drain electrode DE.

As described, although the first insulating layer CIL has a unique brittleness for the inorganic material, since the first insulating layer CIL includes the plurality of openings OP disposed to be separated from each other in the direction corresponding to the outer area OA of the substrate 100, even if stress is applied to the border ED of the substrate 100, the stress is blocked by the opening OP, and the stress transmitted to the display unit 200 is minimized.

In embodiments, by including the first insulating layer CIL with the plurality of openings OP, the wavy line CL, and the cover layer CP, the display device with improved durability is provided.

Next, the display device according to another embodiment will be described with reference to FIG. 5. Hereinafter, parts of the display device according to an embodiment, different from those described above, will be described.

Figure 5:
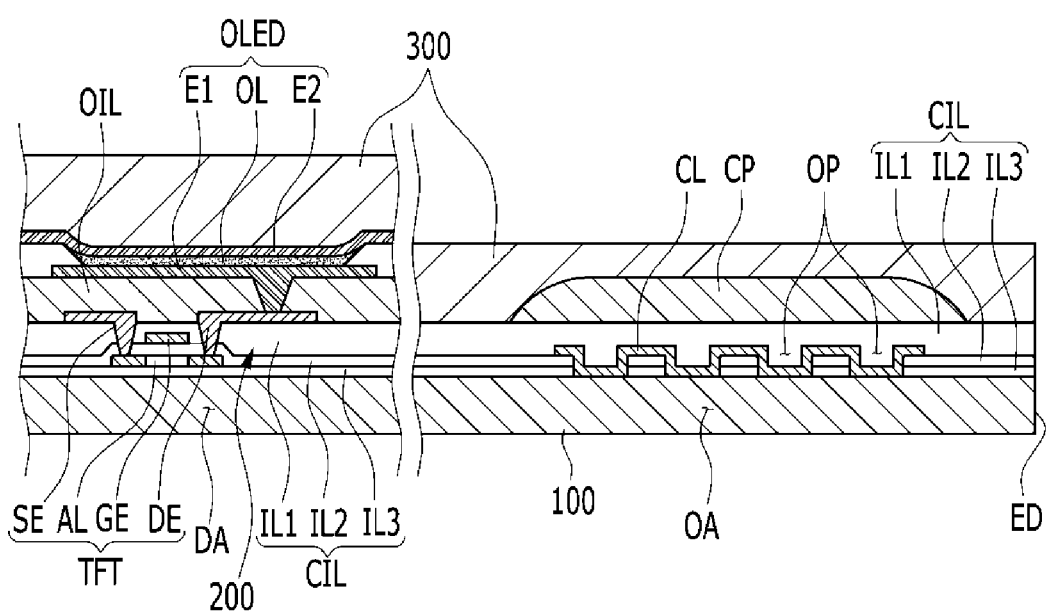
FIG. 5 is a cross-sectional view showing a part of a display device according to another embodiment.

FIG. 5 is a cross-sectional view of a part of a display device according to another embodiment.

As shown in FIG. 5, the display device according to another embodiment includes the substrate 100, the display unit 200, the first insulating layer CIL, the wavy line CL, the second insulating layer OIL, the cover layer CP, and the encapsulation part 300.

The opening OP is formed in the first insulating layer CIL, and more specifically, is formed in the second sub-insulating layer IL2 and the third sub-insulating layer IL3.

The wavy line CL is positioned on the same layer as the gate electrode GE, and thus includes the same material as the gate electrode GE and is simultaneously formed with the gate electrode GE.

As described, although the first insulating layer CIL has a unique brittleness for the inorganic material, since the first insulating layer CIL includes the plurality of openings OP disposed to be separated from each other in the direction corresponding to the outer area OA of the substrate 100, even if stress is applied to the border ED of the substrate 100, the stress is blocked by the opening OP, and thus the stress transmitted to the display unit 200 is minimized.

In embodiments, by including the first insulating layer CIL with the plurality of openings OP, the wavy line CL, and the cover layer CP, the display device with improved durability is provided.

Referring to FIGS. 1 to 5, in embodiments, a display device includes a substrate 100 and is divided into a display section DA and a boundary section OA which may completely or partially surround the display section when viewed in a viewing direction perpendicular to a major surface of the substrate. In the display section, the display device includes an array of pixels, each of which includes an organic light emitting diode OLED and at least a thin film transistor TFT electrically connected to the organic light emitting diode. The boundary section OA may extend along the edge or side ED of the display.

The display device includes a base insulation layer IL1, a gate insulation layer IL2 and an interlayer insulation layer IL3 which are sequentially stacked in the boundary section OA to form an integrated insulation layer CIL. The layer CIL may be formed with an inorganic material and may be brittle. Thus, cracks may be created in the layer CIL by impacts applied to the edge or side ED or by bending the display device, and may be propagated or transmitted toward portions of the layer CIL in the display section. To avoid or minimize such propagation, in embodiments, a plurality of openings OP are formed in the portions of the layer CIL located in the boundary section OA. The openings OP may form a pattern. In embodiments, the openings OP may be arranged to be spaced from each other in a first direction (for example, a direction generally perpendicular to the side ED).

In embodiments, each opening OP may be a hole, a pit, a trench, a groove, a channel or a notch. In one embodiment, the openings OP may extend generally in parallel to the side ED when viewed in the viewing direction. In another embodiment, the openings OP may be a plurality of holes arranged in the boundary section OA. In embodiments, the opening OP may be a through-hole formed through the layer CIL. The opening may be a hole formed through one or two among the sub-layers IL1, IL2 and IL3. (See FIGS. 3-5.)

An undulating conductive material line CL is formed to cross the openings OP when viewed in the viewing direction. The line CL may extend in the first direction while contacting the top surface of the layer CIL and the side surfaces of the bottom surfaces of the openings OP such that the line CL is undulating. When making the display, in embodiments, an electrically conductive material or metal may be formed over the layer CIL with the openings OP and patterned to form the undulating line CL as well as the source and drain electrodes SE and DE. In one embodiment, the undulating line CL may be used to transmit an electric signal from a driver to the pixels. In another embodiment, the undulating line CL is not used as an electric line or wire. The undulating structure of the line CL may minimize or avoid the risk of breakage which may be caused by the cracks in the layer CIL. Further, in embodiments, the undulating structure of the metal line CL may provide durability to the layer CIL.

In embodiments, the openings OP may be covered and filled with another material, for example, an organic material. In the illustrated embodiment, the cover layer CP covers the openings OP.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate comprising a display area and an outer area adjacent to the display area;
an insulating layer on the substrate and comprising a plurality of openings in the outer area, the plurality of openings being arranged to be spaced from each other;
a wiring extending in a direction on the insulating layer; and
a cover layer on the wiring in the outer area,
wherein the wiring is curved a plurality of times in a direction parallel to a surface of the substrate,
wherein the wiring does not overlap the plurality of openings of the insulating layer in a plan view,
wherein the cover layer overlaps the plurality of openings of the insulating layer and the wiring in a plan view, and
wherein the cover layer is disposed in the plurality of openings of the insulating layer, directly contacts the wiring, and is spaced apart from the display area.

2. The display device of claim 1, wherein the wiring extends along top surfaces of the insulating layer.

3. The display device of claim 1, wherein the wiring contacts the insulating layer.

4. The display device of claim 1, wherein the cover layer directly contacts the wiring, and is spaced apart from the display area.

5. The display device of claim 4, wherein the wiring has a horizontally serpentine form.

6. The display device of claim 4, wherein the cover layer comprises an organic material.

7. The display device of claim 6, wherein the insulating layer comprises an inorganic material.

8. The display device of claim 7, wherein the cover layer and the insulating layer directly contact each other near the wiring.

9. The display device of claim 1, wherein the plurality of openings have an island form.

10. The display device of claim 1, wherein the plurality of openings are arranged in a row with a direction from the display area to an edge of the substrate.

11. The display device of claim 10, wherein the direction from the display area to the edge of the substrate is the same direction as an extending direction of the wiring.

12. The display device of claim 1, wherein the plurality of openings exposes the substrate.

13. The display device of claim 12, wherein the substrate is flexible and includes at least one among polymer materials, a metal material, and an inorganic material.

14. The display device of claim 13, wherein the substrate is made of a polyimide.

15. The display device of claim 1, wherein the display area comprises an array of pixels, and each of the pixels comprises:
an organic light emitting element disposed on the substrate; and
a thin film transistor connected to the organic light emitting element,
wherein the thin film transistor comprises:
an active layer over the substrate;
a gate electrode over the active layer; and
a source electrode and a drain electrode connected to the active layer.

16. The display device of claim 15, wherein the insulating layer further comprises a first sub-insulating layer covering the gate electrode.

17. The display device of claim 16, wherein the wiring is on the first sub-insulating layer, and wherein the plurality of openings are in the first sub-insulating layer.

18. The display device of claim 16, wherein the insulating layer further comprises:
a second sub-insulating layer covering the active layer, and
a third sub-insulating layer between the substrate and the active layer.

19. The display device of claim 18, wherein the plurality of openings are in the first sub-insulating layer and the second sub-insulating layer, and
wherein the plurality of openings are not in the third sub-insulating layer.

20. The display device of claim 18, wherein at least one of the first sub-insulating layer, the second sub-insulating layer, and the third sub-insulating layer comprises an inorganic material.

21. The display device of claim 16, wherein the insulating layer further comprises a second sub-insulating layer covering the active layer.

22. The display device of claim 21, wherein the wiring is on the second sub-insulating layer,
wherein the plurality of openings are in the second sub-insulating layer.

23. The display device of claim 22, wherein the insulating layer further comprises a third sub-insulating layer between the substrate and the active layer, and
wherein the plurality of openings are in the second sub-insulating layer and the third sub-insulating layer.

24. The display device of claim 16, wherein the insulating layer further comprises a third sub-insulating layer between the substrate and the active layer,
wherein the plurality of openings are in the third sub-insulating layer.

25. The display device of claim 16, further comprising a second insulating layer between the organic light emitting element and the thin film transistor,
   wherein the second insulating layer comprises an organic material, comprising at least one among polyimide, phenylene, and siloxane, and
   wherein the cover layer is disposed as the same layer as the second insulating layer.

26. The display device of claim 1, wherein the cover layer completely fills the plurality of openings.

* * * * *